(12) United States Patent
Xi et al.

(10) Patent No.: US 9,343,952 B2
(45) Date of Patent: May 17, 2016

(54) SYSTEM AND METHOD FOR CONTROLLING CHARGE PUMP CIRCUIT, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Yusheng Xi, Beijing (CN); Haichen Hu, Beijing (CN); Chunbing Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/492,589

(22) Filed: Sep. 22, 2014

(65) Prior Publication Data

US 2015/0333620 A1    Nov. 19, 2015

(30) Foreign Application Priority Data

May 14, 2014    (CN) .......................... 2014 1 0203636

(51) Int. Cl.
*G09G 3/36* (2006.01)
*H02M 1/36* (2007.01)
(Continued)

(52) U.S. Cl.
CPC .............. *H02M 1/36* (2013.01); *G09G 3/2096* (2013.01); *H02M 3/07* (2013.01); *H03K 17/20* (2013.01); *G09G 2310/0251* (2013.01);
(Continued)

(58) Field of Classification Search
CPC ... G09G 3/36; G09G 3/3696; G09G 2320/04; G09G 2320/048
See application file for complete search history.

(56) References Cited

U.S. PATENT DOCUMENTS

2003/0231155 A1   12/2003   Ogawa
2006/0279494 A1*  12/2006   Yen .................... G09G 3/002
                                                        345/84
(Continued)

FOREIGN PATENT DOCUMENTS

CN    101278327 A    10/2008
CN    101452675 A    6/2009
(Continued)

OTHER PUBLICATIONS

First Office Action regarding Chinese application No. 201410203636.6, dated Feb. 3, 2016. Translation provided by Dragon Intellectual Property Law Firm.

*Primary Examiner* — Kenneth Bukowski
(74) *Attorney, Agent, or Firm* — Harness, Dickey & Pierce, P.L.C.

(57) ABSTRACT

The present disclosure provides a system and a method for controlling a charge pump circuit, and a display device. The system includes the charge pump circuit configured to output a driving voltage to a gate driver circuit; and a controlling device in communication with the charge pump circuit and a timer and configured to, when a working time of the gate driver circuit is equal to a predefined working time threshold, reset the working time of the gate driver circuit to an initial value, acquire a compensating voltage corresponding to the working time of the gate driver circuit in accordance with a correspondence between the working time and the compensating voltage, output a compensating voltage signal and increase the driving voltage outputted by the charge pump circuit by the compensating voltage.

18 Claims, 3 Drawing Sheets

(51) Int. Cl.
    *H02M 3/07* (2006.01)
    *H03K 17/20* (2006.01)
    *G09G 3/20* (2006.01)

(52) U.S. Cl.
    CPC ... *G09G 2310/08* (2013.01); *G09G 2320/0204* (2013.01); *G09G 2320/045* (2013.01)

(56) References Cited

U.S. PATENT DOCUMENTS

2008/0252571 A1* 10/2008 Hente et al. .......... G09G 3/3208
                                                    345/76
2009/0243987 A1* 10/2009 Chang ................. G09G 3/3655
                                                    345/94
2011/0191042 A1*  8/2011 Chaji .................. G09G 3/32
                                                    702/64
2014/0168186 A1*  6/2014 Kang .................. G09G 3/3648
                                                    345/212

FOREIGN PATENT DOCUMENTS

| CN | 101546528 A | 9/2009 |
| CN | 101562047 A | 10/2009 |
| CN | 101562048 A | 10/2009 |
| CN | 102741910 A | 10/2012 |

* cited by examiner

9,343,952 B2

SYSTEM AND METHOD FOR CONTROLLING CHARGE PUMP CIRCUIT, AND DISPLAY DEVICE

CROSS-REFERENCE TO RELATED APPLICATION

The present disclosure claims a priority of the Chinese patent application No. 201410203636.6 filed on May 14, 2014, which is incorporated herein by reference in its entirety.

TECHNICAL FIELD

The present disclosure relates to the field of display technology, in particular to a system and a method for controlling a charge pump circuit, and a display device.

BACKGROUND

A traditional display device controls pixels by driving a thin film transistor (TFT) on a panel using an external driver chip circuit, thereby to display an image. Along with the development of technologies, the display device has recently been evolved into a structure where a driver circuit, instead of the external driver chip circuit, is directly formed on the panel, so as to reduce the number of elements and the production cost for the traditional display device. For example, such a technology as integrating a gate driver circuit capable of controlling an on/off state of a gate electrode of the TFT into the panel, i.e., a gate driver on array (GOA) technology, is applied.

As shown in FIG. 1, in a circuit design for the existing display device, a charge pump circuit 10 outputs a gate driving voltage, which includes a gate turning-on voltage VGH and a gate turning-off voltage VGL, to a shift register 12 of a gate driver circuit 11, so as to enable a display panel 13 to display the image normally. However, during the manufacture of the display device, the gate driving voltage outputted by the charge pump circuit 10 is usually a constant value, and after the display device operates for a long period of time, a turning-on current $I_{on}$ of the TFT is decreased obviously and a turning-off current $I_{off}$ is increased obviously, so an on-off ratio of the TFT is reduced and the voltage of the gate driver circuit is insufficient to enable the TFT to operate normally. As a result, each pixel is charged insufficiently, resulting in a degradation of the display quality and a reduction in the service life of the display device. This defect is particularly obvious when the TFT is an a-Si TFT.

SUMMARY

An object of the present disclosure is to provide a system and a method for controlling a charge pump circuit, and a display device, so as to effectively improve the display quality of the display device and prolong its service life.

In one aspect, the present disclosure provides a system for controlling a charge pump circuit, including:
the charge pump circuit configured to output a driving voltage to a gate driver circuit; and
a controlling device in communication with the charge pump circuit and configured to, when a working time of the gate driver circuit is equal to a predefined working time threshold, reset the working time of the gate driver circuit to an initial value, acquire a compensating voltage corresponding to the working time of the gate driver circuit in accordance with a correspondence between the working time of the gate driver circuit and the compensating voltage, output a compensating voltage signal and increase the driving voltage outputted by the charge pump circuit by the compensating voltage.

According to the present disclosure, after the display device operates for a long period of time, a turning-on current $I_{on}$ of a TFT is decreased obviously while a turning-off current $I_{off}$ is increased obviously, resulting in a reduction in a switch ratio of the TFT. The driving voltage outputted by the charge pump circuit to the gate driver circuit is increased by the compensating voltage corresponding to the working time of the gate driver circuit along wish an increase in the working time of the gate driver circuit, so as to increase the gate driving voltage, ensure that the voltage of the gate driver circuit is sufficient to enable the TFT to operate normally, and increase a charge rate of each pixel, thereby to prevent a degradation of the display quality due to a reduction in the switch ratio of the TFT. As a result, it is able to improve the display quality of the display device, and prolong the service life thereof.

Alternatively, the correspondence between the working time of the gate driver circuit and the compensating voltage is a constant function.

Alternatively, the compensating voltage is in a range of 0.1V to 0.5V.

Alternatively, the working time threshold is 1000 hours.

Alternatively, the correspondence between the working time of the gate driver circuit and the compensating voltage is determined in accordance with the relationship between current-voltage of a TFT and time.

Alternatively, the correspondence between the working time of the gate driver circuit and the compensating voltage is a function.

Alternatively, the system further includes a timer in communication with the controlling device and configured to record the working time of the gate driver circuit.

Alternatively, the timer is a counter with a counting frequency identical to a clock frequency of a scanning signal of the gate driver circuit.

Alternatively, the charge pump circuit receives a source voltage outputted by a power supply integrated circuit of a display device and the compensating voltage signal outputted by the controlling device, and outputs the driving voltage to which the compensating voltage has been added.

Alternatively, the controlling device includes a charge pump interface circuit configured to output a signal to the charge pump circuit.

Alternatively, the controlling device determines a reference compensating voltage in accordance with the compensating voltage and a duty ratio of an output signal of the charge pump interface circuit, outputs the reference compensating voltage signal to the charge pump interface circuit, and after the charge pump circuit receives the compensating voltage signal, the controlling device increases the driving voltage outputted by the charge pump circuit by the compensating voltage.

Alternatively, the gate driver circuit includes a shift register, to which the driving voltage is outputted by the charge pump circuit.

Alternatively, the system further includes a memory in communication with the controlling device and configured to store a value of the driving voltage outputted by the charge pump circuit.

In another aspect, the present disclosure provides a display device including the above-mentioned system for controlling the charge pump circuit. The display device also has the above-mentioned advantageous effects.

In yet another aspect, the present disclosure provides a method for controlling a charge pump circuit, including:

determining whether or not a working time of a gate driver circuit is equal to a predefined working time threshold; and when the working time of the gate driver circuit is equal to the predefined working time threshold, resetting the working time of the gate driver circuit to an initial value, acquiring a compensating voltage corresponding to the working time of the gate driver circuit in accordance with a correspondence between the working time of the gate driver circuit and the compensating voltage, outputting a compensating voltage signal, and increasing a driving voltage outputted by the charge pump circuit by the compensating voltage.

According to the method for controlling the charge pump circuit, it is able to automatically adjust the driving voltage outputted by the charge pump circuit to the gate driver circuit along with an increase in the working time of the gate driver circuit, ensure that the voltage of the gate driver circuit is sufficient to enable the TFT to operate normally, and increase a charge rate of each pixel, thereby to prevent a degradation of the display quality due to a reduction in the switch ratio of the TFT. As a result, it is able to improve the display quality of the display device, and prolong the service life thereof.

In yet another aspect, the present disclosure provides a device for controlling a charge pump circuit, including:

a determination module configured to determine whether or not a working time of a gate driver circuit is equal to a predefined working time threshold; and a transmission module configured to, when the working time of the gate driver circuit is equal to the predefined working time threshold, reset the working time of the gate driver circuit to an initial value, acquire a compensating voltage corresponding to the working time of the gate driver circuit in accordance with a correspondence between the working time of the gate driver circuit and the compensating voltage, output a compensating voltage signal, and increase a driving voltage outputted by the charge pump circuit by the compensating voltage.

According to the device for controlling the charge pump circuit, it is able to automatically adjust the driving voltage outputted by the charge pump circuit to the gate driver circuit along with an increase in the working time of the gate driver circuit, ensure that the voltage of the gate driver circuit is sufficient to enable the TFT to operate normally, and increase a charge rate of each pixel, thereby to prevent a degradation of the display quality due to a reduction in the switch ratio of the TFT. As a result, it is able to improve the display quality of the display device, and prolong the service life thereof.

DETAILED DESCRIPTION

An object of the present disclosure is to provide a system, a method and a device for controlling a charge pump circuit, and a display device, so as to effectively improve the display quality of the display device and prolong its service life. According to the system of the present disclosure, it is able to adjust a driving voltage outputted by the charge pump circuit to a gate driver circuit along with an increase in a working time of the gate driver circuit, increase a gate driving voltage, ensure that the voltage of the gate driver circuit is sufficient to enable a TFT to operate normally, and increase a charge rate of each pixel, thereby to prevent a degradation of the display quality due to a reduction in the on-off ratio of the TFT. As a result, it is able to improve the display quality of the display device, and prolong its service life.

In order to make the objects, the technical solutions and the advantages of the present disclosure more apparent, the present disclosure will be described hereinafter in conjunction with the embodiments.

Figure 1:
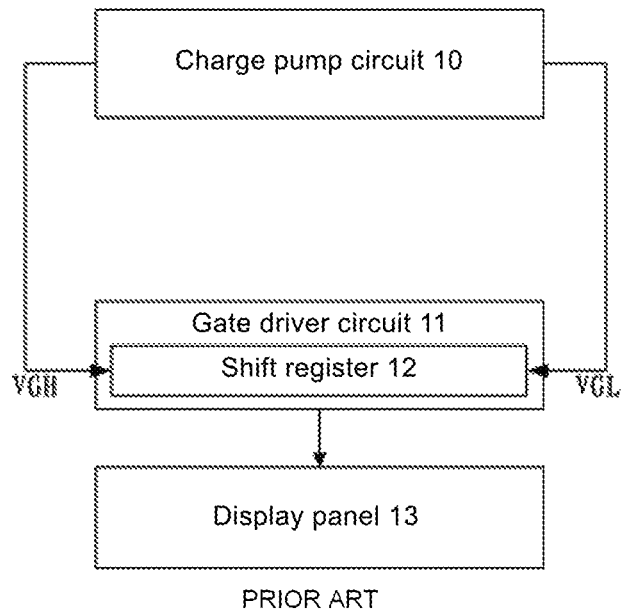
FIG. 1 is a schematic view showing a circuit of an existing display device.
Figure 2:
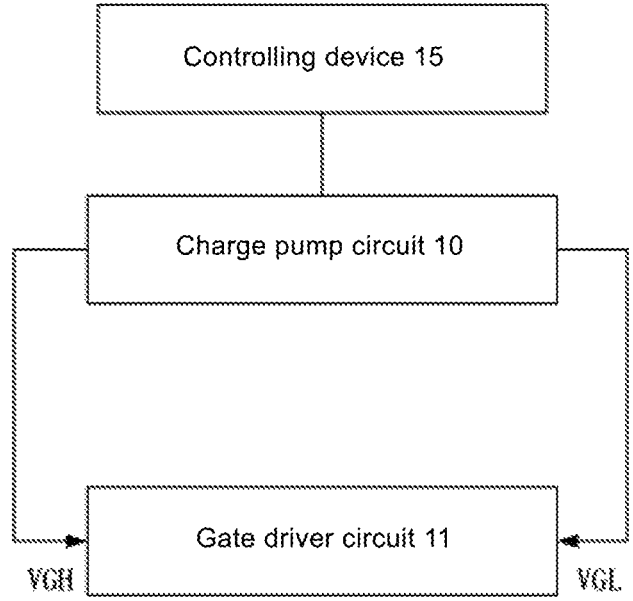
FIG. 2 is a schematic view showing a system for controlling a charge pump circuit according to one embodiment of the present disclosure.
Figure 3:
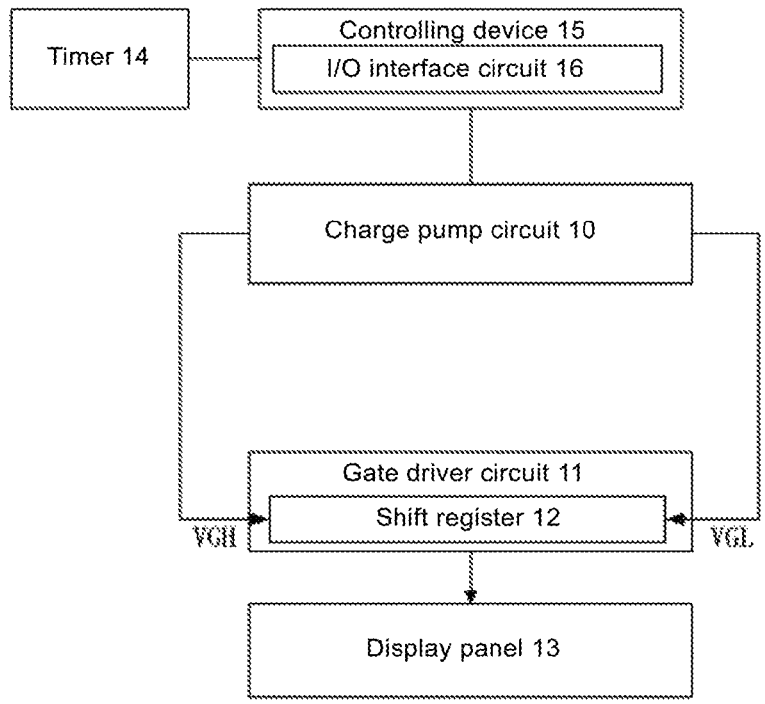
FIG. 3 is a schematic view showing a system for controlling the charge pump circuit according to another embodiment of the present disclosure.

Referring to FIGS. 2 and 3, the present disclosure provides a system for controlling a charge pump circuit, which includes:

a charge pump circuit 10 configured to output a driving voltage to a gate driver circuit 11; and a controlling device 15 in communication with the charge pump circuit 10 and configured to, when a working time of the gate driver circuit 11 is equal to a predefined working time threshold, reset the working time of the gate driver circuit 11 to an initial value, acquire a compensating voltage corresponding to the working time of the gate driver circuit 11 in accordance with a correspondence between the working time and the compensating voltage, output a compensating voltage signal, and increase the driving voltage outputted by the charge pump circuit 10 by the compensating voltage.

Usually, when a display device operates, the gate driver circuit receives a sequence control signal and a gate driving voltage outputted by the charge pump circuit, so as to output a scanning signal in frames to a scanning line of a display panel. The sequence control signal is used to control a scanning frequency of the gate driver circuit. Usually, the existing sequence control signal is outputted by a sequence controller.

Functional units of the controlling deive may be integrated into a processing module, or they may be formed separately, or two or more of them may be integrated into a module. The module may be implemented in a hardware form or formed as a software functional module. If the module is formed as the software functional module and sold or used as a separate product, it may also be stored in a computer-readable storage medium. Hence, the controlling device 15 of the present disclosure may be integrated with a sequence controller module. Of course, the controlling means may also be integrated with all controller units of the display device.

A timer programmed using a programming language may be provided in the controlling means so as to record the working time of the gate driver circuit, i.e., the timer may be implemented in a software form. Also, a timer in a hardware form may be used. The controlling device outputs a timing signal when the sequence control signal for controlling the scanning frequency of the gate driver circuit is inputted thereinto. If the timer in a hardware form is used, the controlling device outputs a signal to the timer at the same time so as to start the timer.

The charge pump circuit 10 receives a source voltage outputted by a power supply integrated circuit of the display device and the compensating voltage signal outputted by the controlling device 15, and outputs the driving voltage to which the compensating voltage has been added.

When the working time of the gate driver circuit 11 is equal to the predefined working time threshold, the working time of the gate driver circuit 11 is reset to the initial value, i.e., when the working time of the gate driver circuit 11 is equal to the predefined working time threshold, the working time of the gate driver circuit is re-counted. The driving voltage outputted by the charge pump circuit 10 is adjusted every time when the working time of the gate driver circuit is equal to the predefined working time threshold.

When the working time of the gate driver circuit 11 is equal to the predefined working time threshold, the compensating voltage corresponding to the working time of the gate driver circuit 11 is acquired in accordance with the correspondence between the working time of the gate driver circuit 11 and the compensating voltage. When the compensating voltage corresponding to the working time of the gate driver circuit 11 is acquired in accordance with the correspondence between the working time of the gate driver circuit 11 and the compensating voltage, usually an initial driving voltage $V_0$ outputted by the charge pump circuit may also be taken into consideration, i.e., the compensating voltage $V_{compensating}=f(t, V_0)$. $V_0$ is a constant value, so the correspondence between the working time of the gate driver circuit 11 and the compensating voltage may be simplified as $V_{compensating}=f(t)$.

The correspondence between the working time of the gate driver circuit 11 and the compensating voltage may be determined in accordance the relationship between current-voltage of the TFT and time. For example, in another embodiment of the present disclosure, the correspondence between the working time of the gate driver circuit and the compensating voltage is a constant function, i.e., every time when the working time of the gate driver circuit is equal to the predefined working time threshold, the predefined compensating voltage signal, i.e., a constant value, is outputted, so as to increase the driving voltage outputted by the charge pump circuit by the predefined compensating voltage.

The controlling device 15 usually includes a charge pump interface circuit (I/O interface circuit 16) for outputting a signal to the charge pump circuit 10. When the compensating voltage signal is outputted by the controlling device, it is required to take a duty ratio of an output signal of the I/O interface circuit 16 into consideration. To be specific, the controlling device determines a reference compensating voltage in accordance with the compensating voltage and the duty ratio of the output signal of the I/O interface circuit 16, outputs a reference compensating voltage signal to the I/O interface circuit 16, and after the charge pump circuit 10 receives the compensating voltage signal, the controlling device increases the driving voltage outputted by the charge pump 10 by the compensating voltage.

The predefined working time threshold of the gate driver circuit is not defined particularly, and it may be determined in accordance with the electrical properties of the TFT, e.g., it may be set as 1000 hours. The predefined compensating voltage may be determined in accordance with the electrical properties of the TFT too, e.g., it may be set as in the range of 0.1V to 0.5V. In other words, every time when the gate driver circuit operates for 1000 hours, the driving voltage outputted by the charge pump circuit is increased by the compensating voltage of 0.1V to 0.5V.

Referring to FIG. 3, in another embodiment of the system for controlling the charge pump circuit, a timer 14 in a hardware form is used to record the working time of the gate driver circuit, i.e., the system further includes the timer 14 for recording the working time of the gate driver circuit 11. The timer 14 is in communication with the controlling device 15. Taking the correspondence between the working time of the gate driver circuit and the compensating voltage being a constant function as an example, the operation procedures of the system will be described hereinafter.

When the display device starts to operate, the controlling device outputs a signal to the timer 14 and the timer 14 starts to count. When the display device operates for a long period of time, i.e., when the working time of the gate driver circuit 11 recorded by the timer 14 is equal to the working time threshold, the controlling device 15 outputs the predefined compensating voltage signal, so as to increase the driving voltage outputted by the charge pump circuit 10 by the predefined compensating voltage.

The timer 14 may be programmed so as to record the working time of the gate driver circuit in a subtractive manner. When the counting operation of the timer 14 in a subtractive manner is ended, i.e., when the working time of the gate driver circuit is equal to the working time threshold, the timer starts to recount, i.e. the working time of the gate driver circuit recorded by the timer is reset to the initial value. Because the timer records the working time in a subtractive manner, it may be an erasable programmable read only memory (EPROM) in which contents can be modified frequently. Also, the timer may record the working time in an additive manner. The counting ways of the timer are not particularly defined herein, as long as the timer can record the working time of the gate driver circuit.

The timer 14 may be integrated into the controlling device, or a video signal format conversion circuit of the display device in this embodiment. When the timer 14 is integrated into the video signal format conversion circuit of the display device, it is able to effectively improve the counting accuracy of the timer and the accuracy of the system, thereby to improve the display quality of the display device and prolong the service life thereof.

As shown in FIG. 3, the gate driver circuit 11 usually includes a shift register 12. The charge pump circuit 10 outputs the driving voltage, which includes a gate turning-on voltage VGH and a gate turning-off voltage VGL, to the gate driver circuit 11 (to be specific, to the shift register 12), so as to enable a display panel 13 to display an image normally.

Figure 4:
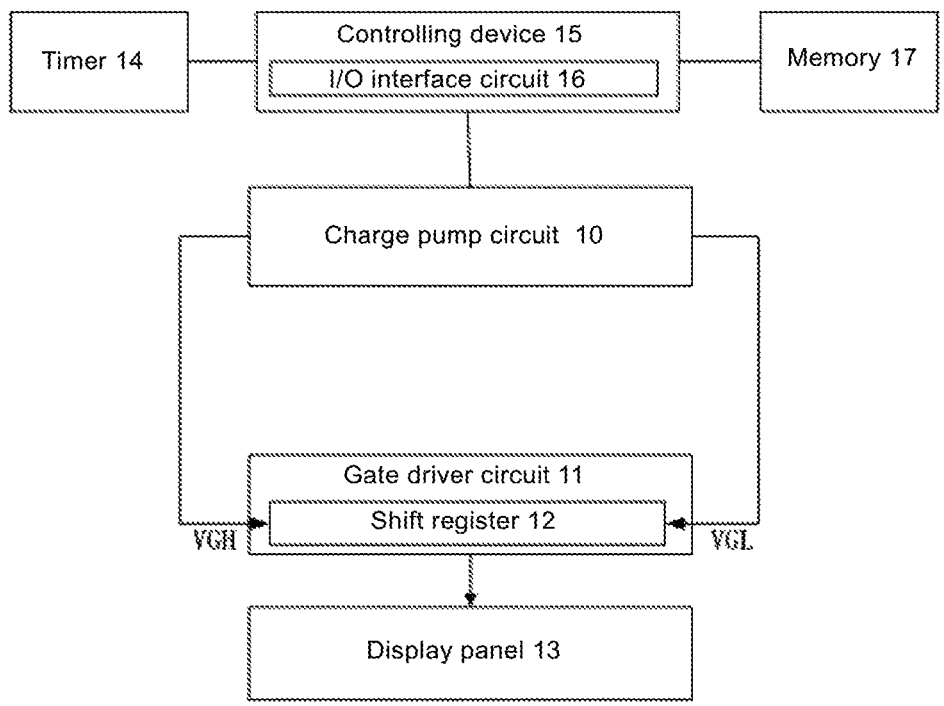
FIG. 4 is a schematic view showing a system for controlling the charge pump circuit according to yet another embodiment of the present disclosure.

As shown in FIG. 4, the system for controlling the charge pump circuit may further include a memory 17 in communication with the controlling device 15 and configured to store a value of the driving voltage outputted by the charge pump circuit 10.

The memory 17 may be in various forms, e.g., a counter for storing the driving voltage. The memory may also be integrated into the controlling device, or the video signal format conversion circuit of the display device, which is not particularly defined. The controlling device 16 may be of various types, e.g., a single-chip microcomputer or a personal computer.

On the basis of the operation procedures of the system for controlling charge pump circuit as mentioned above, as compared with the prior art where the driving voltage outputted by the charge pump circuit 10 to the gate driver circuit 11 is set as a constant value when manufacturing the display device and cannot be adjusted, in the present disclosure, the driving voltage (the gate turning-on voltage VGH and the gate turning-off voltage VGL) outputted by the charge pump circuit 10 to the gate driver circuit 11 can be adjusted automatically along with an increase in the working time of the gate driver circuit 11, so as to increase the gate driving voltage, ensure that the voltage of the gate driver circuit is sufficient to enable the TFT to operate normally, and increase a charge rate of each pixel, thereby to prevent a degradation of the display quality due to a reduction in the switch ratio of the TFT. As a result, it is able to improve the display quality of the display device, and prolong the service life thereof.

The timer 14 may be in various forms, e.g., a counter. In order to further improve the accuracy of the system and the accuracy of the compensating voltage, a counting frequency of the counter may be set as identical to a clock frequency of a scanning signal of the gate driver circuit.

The scanning signal is a level signal inputted at a certain frequency, i.e., the scanning signal is a periodic one. The counter has a frequency identical to that of the scanning signal, i.e., the counter is incremented by 1 every time the scanning signal is inputted. Presumed that the working time threshold of the gate driver circuit is the time required for inputting the scanning signal 1000 times, the working time of the gate driver circuit is equal to the working time threshold when the counter is incremented to 1000 at the frequency of the scanning signal. The clock frequency of the scanning signal of the gate driver circuit is identical to a clock frequency of the video signal format conversion circuit of the display device, i.e., the counting frequency of the counter is identical to the clock frequency of the video signal format conversion circuit. As a result, it is able to record the working time of the gate driver circuit in a more accurate manner, thereby to improve the accuracy of the compensating voltage and the accuracy of the system, and improve the display quality of the display device.

The system for controlling the charge pump circuit of this embodiment may be applied to a display device, or any other devices involving the output of the driving voltage from the charge pump circuit to the gate driver circuit.

Based on the above system for controlling the charge pump circuit, the present disclosure further provides a display device. The display device may be any products or members having a display function, such as a mobile phone, a flat panel PC, a liquid crystal panel, a liquid crystal TV, a liquid crystal display, an OLED panel, an OLED TV, an OLED display, a laptop PC, a digital photo frame, and a navigator. The display device includes the system for controlling the charge pump circuit, so it also has the above-mentioned advantageous effects.

Figure 5:
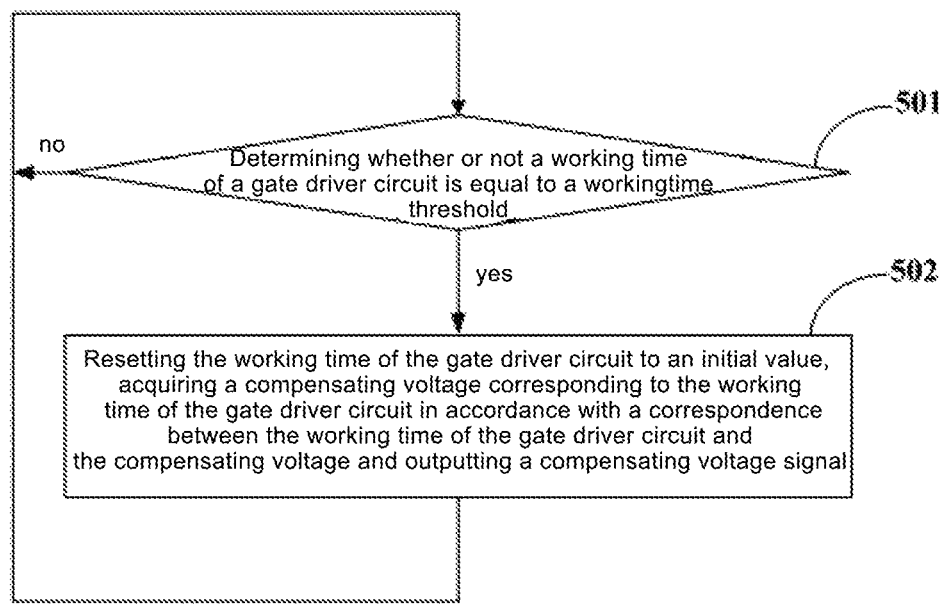
FIG. 5 is a flow chart of a method for controlling a charge pump circuit according to one embodiment of the present disclosure.

Based on the same inventive concept, as shown in FIG. 5, the present disclosure further provides a method for controlling the charge pump circuit, including:

Step 501: determining whether or not a working time of a gate driver circuit is equal to a predefined working time threshold, if yes, proceeding to Step 502, and otherwise continuing to perform Step S501: and Step 502: resetting the working time of the gate driver circuit to an initial value, acquiring a compensating voltage corresponding to the working time of the gate driver circuit in accordance with a correspondence between the working time of the gate driver circuit and the compensating voltage, outputting a compensating voltage signal, and increasing a driving voltage outputted by the charge pump circuit by the compensating voltage.

According to the method of the present disclosure, it is able to automatically adjust the driving voltage outputted by the charge pump circuit to the gate driver circuit along with an increase in the working time of the gate driver circuit, ensure that the voltage of the gate driver circuit is sufficient to enable the TFT to operate normally, and increase a charge rate of each pixel, thereby to prevent a degradation of the display quality due to a reduction in the switch ratio of the TFT. As a result, it is able to improve the display quality of the display device, and prolong the service life thereof.

Figure 6:
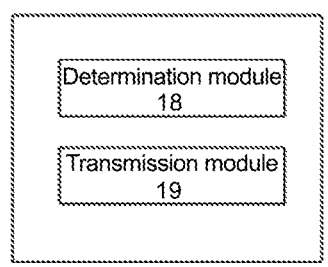
FIG. 6 is a schematic view showing a device for controlling a charge pump circuit according to one embodiment of the present disclosure.

Based on the same inventive concept, as shown in FIG. 6, the present disclosure further provides a device for controlling a charge pump circuit, including:

a determination module 18 configured to determine whether or not a working time of a gate driver circuit is equal to a predefined working time threshold; and a transmission module 19 configured to, when the working time of the gate driver circuit is equal to the predefined working time threshold, reset the working time of the gate driver circuit to an initial value, acquire a compensating voltage corresponding to the working time of the gate driver circuit in accordance with a correspondence between the working time of the gate driver circuit and the compensating voltage, output a compensating voltage signal, and increase a driving voltage outputted by the charge pump circuit by the compensating voltage.

According to the device for controlling the charge pump circuit, it is able to automatically adjust the driving voltage outputted by the charge pump circuit to the gate driver circuit along with an increase in the working time of the gate driver circuit, ensure that the voltage of the gate driver circuit is sufficient to enable the TFT to operate normally, and increase a charge rate of each pixel, thereby to prevent a degradation of the display quality due to a reduction in the switch ratio of the TFT. As a result, it is able to improve the display quality of the display device, and prolong the service life thereof.

Obviously, a person skilled in the art may make further modifications and improvements without departing from the spirit and scope of the present disclosure. If these modifications and improvements fall within the scope of the appended claims and the equivalents thereof, the present disclosure is also intended to include these modifications and improvements.

What is claimed is:

1. A system for controlling a charge pump circuit, comprising:

the charge pump circuit configured to output a driving voltage to a gate driver circuit; and a controlling device in communication with the charge pump circuit and configured to, when a working time of the gate driver circuit is equal to a predefined working time threshold, reset the working time of the gate driver circuit to an initial value, acquire a compensating voltage corresponding to the working time of the gate driver circuit in accordance with a correspondence between the working time of the gate driver circuit and the compensating voltage, output a compensating voltage signal and increase the driving voltage outputted by the charge pump circuit by the compensating voltage, wherein the controlling device comprises a charge pump interface circuit configured to output a signal to the charge pump circuit, the controlling device configured to:

determine a reference compensating voltage in accordance with the compensating voltage and a duty ratio of an output signal of the charge pump interface circuit, output a reference compensating voltage signal to the charge pump interface circuit, and after the charge pump circuit receives the compensating voltage signal, increase the driving voltage outputted by the charge pump circuit by the compensating voltage.

2. The system according to claim 1, wherein the correspondence between the working time of the gate driver circuit and the compensating voltage is a constant function.

3. The system according to claim 2, wherein the compensating voltage is in a range of 0.1V to 0.5V.

4. The system according to claim 2, wherein the working time threshold is 1000 hours.

5. The system according to claim 2, further comprising a timer in communication with the controlling device and configured to record the working time of the gate driver circuit.

6. The system according to claim 1, wherein the correspondence between the working time of the gate driver circuit and the compensating voltage is determined in accordance with the relationship between current-voltage of a TFT and time.

7. The system according to claim 1, wherein the correspondence between the working time of the gate driver circuit and the compensating voltage is a function.

8. The system according to claim 1, further comprising a timer in communication with the controlling device and configured to record the working time of the gate driver circuit.

9. The system according to claim 8, wherein the timer is a counter with a counting frequency identical to a clock frequency of a scanning signal of the gate driver circuit.

10. The system according to claim 1, wherein the charge pump circuit receives a source voltage outputted by a power supply integrated circuit of a display device and the compensating voltage signal outputted by the controlling device, and outputs the driving voltage to which the compensating voltage has been added.

11. The system according to claim 1, wherein the gate driver circuit comprises a shift register, to which the driving voltage is outputted by the charge pump circuit.

12. The system according to claim 1, further comprising a memory in communication with the controlling device and configured to store a value of the driving voltage outputted by the charge pump circuit.

13. A display device, comprising the system for controlling the charge pump circuit according to claim 1.

14. A method for controlling a charge pump circuit, comprising:
    determining whether or not a working time of a gate driver circuit is equal to a predefined working time threshold;
    when the working time of the gate driver circuit is equal to the predefined working time threshold, resetting the working time of the gate driver circuit to an initial value, acquiring a compensating voltage corresponding to the working time of the gate driver circuit in accordance with a correspondence between the working time of the gate driver circuit and the compensating voltage, outputting a compensating voltage signal, and increasing a driving voltage outputted by the charge pump circuit by the compensating voltage, and
    determining a reference compensating voltage in accordance with the compensating voltage and a duty ratio of a signal outputted by a charge pump interface circuit to the charge pump circuit, outputting a reference compensating voltage signal to the charge pump interface circuit, and after receiving, by the charge pump circuit, the compensating voltage signal, increasing the driving voltage outputted by the charge pump circuit by the compensating voltage.

15. The method according to claim 14, wherein the correspondence between the working time of the gate driver circuit and the compensating voltage is a constant function.

16. The method according to claim 15, wherein the compensating voltage is in a range of 0.1V to 0.5V.

17. The method according to claim 14, wherein the correspondence between the working time of the gate driver circuit and the compensating voltage is a function.

18. The method according to claim 14, wherein the working time threshold is 1000 hours.

* * * * *